United States Patent [19]

Lee et al.

[11] Patent Number: 5,563,448
[45] Date of Patent: Oct. 8, 1996

[54] OHMIC CONTACT STRUCTURE OF A HIGHLY INTEGRATED SEMICONDUCTOR DEVICE HAVING TWO RESISTANCE CONTROL LAYERS FORMED BETWEEN A METAL ELECTRODE AND THE SUBSTRATE

[75] Inventors: Sangin Lee, Suwon; Soonoh Park, Seoul, both of Rep. of Korea

[73] Assignee: Samsung Electronics Co., Ltd., Suwon City, Rep. of Korea

[21] Appl. No.: 204,568

[22] Filed: Mar. 2, 1994

[30] Foreign Application Priority Data

Mar. 2, 1993 [KR] Rep. of Korea ............... 1993-2962

[51] Int. Cl.⁶ .................................................. H01L 23/34
[52] U.S. Cl. ........................ 257/742; 257/743; 257/751
[58] Field of Search .............................. 437/41; 257/742, 257/743, 751, 742, 743, 751

[56] References Cited

U.S. PATENT DOCUMENTS 4,738,937  4/1988  Parsons ................................. 437/180
5,108,954  4/1992  Sandhu et al. ....................... 437/200
5,126,805  6/1992  Bulat et al. ........................... 257/742
5,242,847  9/1993  Ozturk et al. ......................... 437/41

Primary Examiner—William Mintel
Assistant Examiner—Roy Potter
Attorney, Agent, or Firm—Cushman Darby & Cushman, L.L.P.

[57] ABSTRACT

An ohmic contact structure for connection of a metal electrode to a highly integrated semiconductor device and a method for making the same. A contact hole is selectively formed in an insulating layer. A contact structure of a hetero-junction of Ge and $Si_{1-x}Ge_x$ whose bandgap is lower than that of the underlying substrate material is formed between the interface of the metal electrode and the semiconductor substrate. The hetero-junction structure minimizes stress and strain between the metal electrode and the semiconductor substrate. The ohmic contact structure lowers the resistance of electronic lines and increases the reliability of integrated semiconductor devices.

4 Claims, 5 Drawing Sheets

OHMIC CONTACT STRUCTURE OF A HIGHLY INTEGRATED SEMICONDUCTOR DEVICE HAVING TWO RESISTANCE CONTROL LAYERS FORMED BETWEEN A METAL ELECTRODE AND THE SUBSTRATE

BACKGROUND OF THE INVENTION (1) Field of the Invention

The present invention relates to a semiconductor device. More particularly, it relates to an ohmic contact structure for connecting an electrode to a highly integrated semiconductor device and a method for making the ohmic contact structure.

(2) Description of the Prior Art

The degree of high density integrated circuits has been doubling year after year. Presently, mass production of 16 M dynamic random access memory devices has begun using a sub-half micron design rule. The performance speed of these devices is improved over its predecessors, but a resistance-capacitance delay and characteristics of lines are degraded due to the microminiaturization of the lines with the increased integration and with the increased length of the lines. Accordingly, a technique of forming a contact hole in the devices using sub-half micron design rules is important, particularly with respect to the desired goals of low resistance and high reliability of the semiconductor devices.

An electrode is generally connected to a semiconductor device through a contact hole formed on an insulating layer such as a silica glass or a borophosphorous silicate glass. The junction formed between the metal layer and the semiconductor through the contact hole is characterized as a rectifying contact and a non-rectifying contact as first proposed by Shottky in 1940. A non-rectifying contact is theoretically formed in either of the following two cases: First, when the work function of a metal material is smaller than the work function of a semiconductor material in an n-type semiconductor substrate, and second when the work function of a metal material is larger than the work function of a semiconductor substrate in a p-type semiconductor substrate.

An ideal Shottky contact is too difficult to form using today's technology, i.e., to achieve a contact between a metal and a semiconductor with a resistance near zero. U.S. Pat. No. 4,738,937 describes this theory.

U.S. Pat. No. 5,108,954 describes one prior art technique for forming a contact hole to lower the contact resistance as shown in FIG. 1.

FIG. 1 shows a junction region 3 of a semiconductor substrate 1 and in which impurities are implanted. An insulating layer 5 is deposited on a surface of the semiconductor substrate 1 and junction region 3 with a contact hole formed therein above the junction region 3. A diffusion prevention layer 7 of titanium nitride (TIN) or titanium tungstenite (TiW) is formed on the insulating layer 5 and in the contact hole and over the exposed portion of the junction region 3 so as to prevent metal or silicon electromigration resulting from a diffusion of metal and silicon between the semiconductor substrate 1 and a metal layer 9 forming a wiring electrode deposited on the diffusion prevention layer 7. If the metal layer 9 has considerable thickness, it is formed from the bottom of the contact hole to the surface of the insulating layer 5 along sidewalls of the contact hole, thus forming an electrical contact between the semiconductor substrate and the wiring electrode 9.

When a subsequent thermal treatment is performed, i.e., when silicide $TiSi_2$ is formed by a heat treatment of titanium and silicon, out-diffusion occurs causing a sharp drop in the concentration of the dopant in the interface of the diffusion-prevention layer 7. This increases the contact resistance. The relationship between the contact resistance and the dopant concentration will now be described.

A plug implantation technique of additionally ion-implanting the dopant after the contact hole is formed so as to prevent the out-diffusion of the dopant and supplement the reduced dose is known. FIG. 2 shows a plug implantation technique wherein a protrusion 3a is formed under the junction region 3 adjacent to the contact hole. This protrusion 3a does not cause a serious problem in the conventional semiconductor device having a relatively deep junction in a substrate. However, as in the case of a very large scale integrated circuit (VLSI) in which a large number of devices are assembled in a unit area, this protrusion 3a may cause short-circuit conductivity in a semiconductor device having a shallow junction. Thus, this design is disadvantageous in improving performance speed in VLSI devices. Moreover, because the impurity level exceeds the solubility limit in a junction area, the junction area is saturated with the impurity and a deposit of the doped impurity is shown as a separate phase.

Therefore, the impurity level in the junction area is limited. If the deposit is shown in the junction region, an increase of the dose of the impurity cannot further increase carrier density. Furthermore, the deposits into many silicon grains cause a diffusion of the carriers and facilitates reunion of the carriers.

SUMMARY OF THE INVENTION

The present invention lowers the contact resistance through a contact hole of a semiconductor device.

It is one object of the present invention to provide a low resistance contact structure of a highly integrated semiconductor device by forming selectively in a contact hole a material having a band gap smaller than that of a substrate material in the contact hole. The present invention minimizes stress and strain between a metal and a semiconductor by forming a material having a hetero-junction structure thereunder.

It is another object to provide a method for forming effectively an ohmic contact structure having hetero-junction.

According to the present invention, an ohmic contact structure of a semiconductor device comprises a junction region doped with an impurity on a semiconductor substrate. A first resistance control layer having a reduced resistivity is selectively provided on a contact hole over the junction region with a material of a hetero-junction structure whose work function is lower than that of the semiconductor substrate. A second resistance control layer having a reduced resistivity and being formed of a material whose work function is lower than that of the first resistance control layer. A conductive layer forming a wiring electrode is provided on the second resistance control layer.

A method for making a semiconductor device according to the present invention comprises a step of forming a junction region implanted with an impurity on a predetermined portion of a semiconductor substrate. An insulating layer is formed on the semiconductor substrate with a contact hole formed therein by removing a portion of the insulating layer so as to expose a part of the junction region.

A first resistance control layer is formed on the contact hole. A second resistance control layer is formed on the first resistance control. At least one barrier layer is formed on the second resistance control layer and insulating layer, and a heat treatment thereon is performed. A conductive layer is then formed on the barrier layer.

According to one aspect of the present invention, the contact resistance depends on the following expression:

$$Rc \approx A \exp\left[ \frac{4\Pi \epsilon_s m^*}{h} \left( \frac{\psi_B}{N_D} \right) \right]$$

Rc: contact resistance $N_D$: dopant concentration

A: constant h : planck constant $\psi$: barrier layer height m*: effective mass $\epsilon_s$: permittivity According to this expression, internal factors which lower the contact resistance are low barrier layer height, i.e. low work function between a metal and a semiconductor, high concentration dopant, and small effective mass, i.e. high mobility. In order to meet this requirement, Ge which has a more excellent physical characteristic than that of Si and is in the same family as Si, is used as a second resistance control layer of the present invention. For reference, table 1 shows a comparison properties of matter between two materials:

TABLE 1

|  | Si | | Ge |
| --- | --- | --- | --- |
| Structure of Crystal | diamond | | diamond |
| Bandgap (300° K.) | 1.12 eV | | 0.66 eV |
| Mobility (cm²/V Sec) | electron | 1500 | 3,900 |
|  | hole | 450 | 1,900 |

In order to minimize stress and strain generated by a difference of each lattice constant, a first resistance control layer of hetero-junction structure, e.g. $Si_{1-x}Ge_x$ is inserted between silicon and the second resistance control layer. Accordingly, reactions between the metal and the semiconductor layer such as out-diffusion of the dopant, formation of the protrusion by excessive ion-implantation and eduction phenomenon of the doped impurity is effectively controlled by the first and second resistance control layers crossing the wiring electrode and semiconductor layer. As a result of the reduced resistance, the size of the contact hole may be reduced to make further miniaturization of the semiconductor device possible. The resistance control layer is formed to be even and thin by treating the surface of the semiconductor layer with a proper atmospheric gas, by an epitaxial process, or by depositing a proper material.

BRIEF DESCRIPTION OF THE DRAWINGS

The present invention will be better understood with reference to the drawings, in which.

DETAILED DESCRIPTION OF THE PREFERRED EMBODIMENTS

FIGS. 3A to 3E show a preferred embodiment of the present invention and depict process steps in the manufacture of a contact structure by an epitaxial process.

Figure 1:
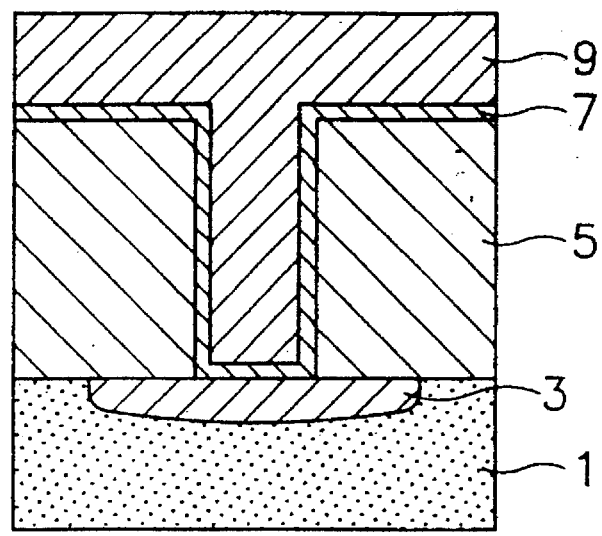
FIG. 1 is a sectional view showing a conventional contact structure of a semiconductor device.
Figure 2:
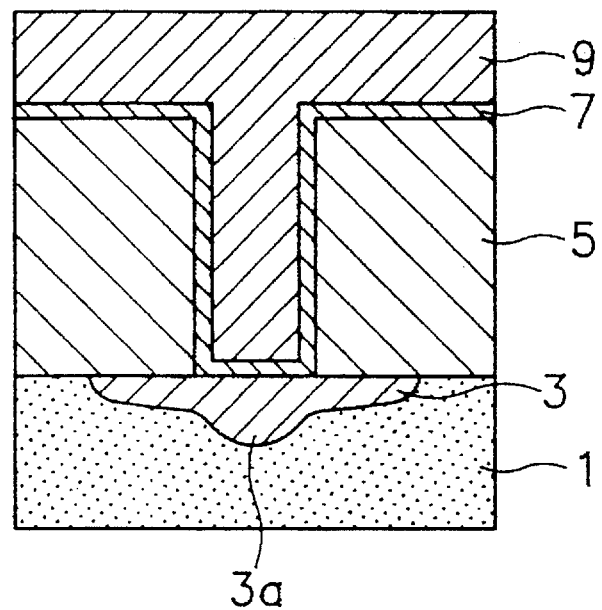
FIG. 2 is a sectional view showing another conventional contact structure of a semiconductor device.
Figure 3A:
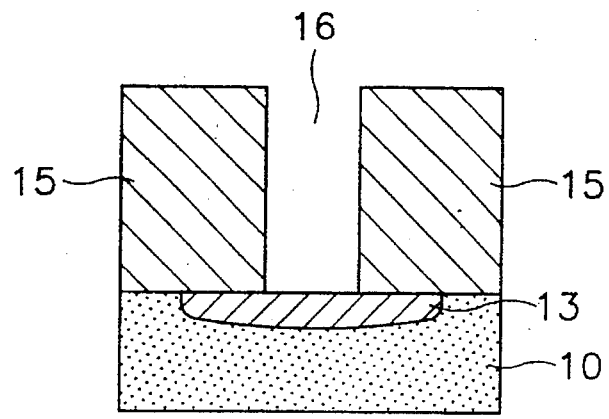
FIGS. 3A to 3E show process steps in the manufacture of a contact structure of a semiconductor device according to preferred embodiments of the present invention.

Referring to FIG. 3A, an impurity of a predetermined conductivity type is ion-implanted into one portion of a semiconductor substrate 10 to form a junction region 13. An insulating layer 15 such as silica glass or boro-phosphorous silicate glass is formed on the semiconductor substrate 10 and the junction region 13, and a contact hole 16 is formed by opening the insulating layer 15 to expose a part of the junction region 13.

Figure 3B:
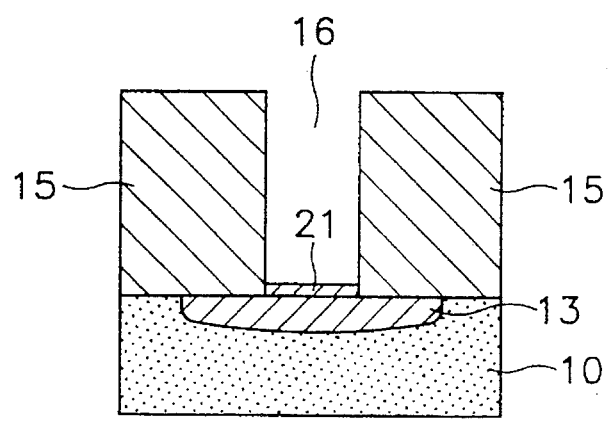
Figure 3C:
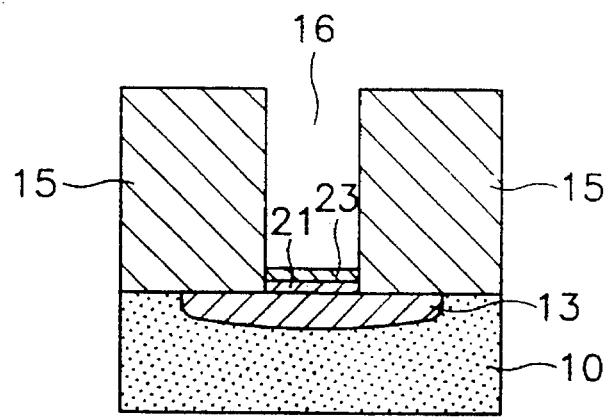

FIG. 3B shows the formation of a $Si_{1-x}Ge_x$ epi-layer 21, a first resistance control layer 21, on the contact hole 16. $SiH_2Cl_2$ and $GeH_4$ using $H_2$ as a carrier gas are used as a reaction gas for the formation of the epilayer. The Ge source is made by mixing 10% $GeH_4$ to $H_2$. The $Si_{1-x}Ge_x$ epi-layer 21 is formed at 600°–900° C. and at a flow rate of 20 sccm to 200 sccm. Preferably, the amount of $SiH_2Cl_2$ is changed to 20–200 sccm at 625° C., 20 slm of $H_2$ flow rate, and 1–10 sccm of $GeH_4$ flow rate. As the flow rate of 10% $GeH_4$ changes, the Ge concentration is also changed, and the thicker the Ge concentration is, the more the growth speed is increased. The growth speed of the $Si_{1-x}Ge_x$ epi-layer 21 is 23 Å/min if Ge is 12%, i.e., in case of 0.88 Si and 0.12 Ge. In case of 0.67 Si and 0.36 Ge, the growth speed is 126 Å/min.

By increasing the flow rate of 10% $GeH_4$ gradually in such a condition, the $Si_{1-x}Ge_x$ epi-layer 21 is grown to a thickness of 100 Å–100 Å, preferably, about 200 Å.

Figure 5:
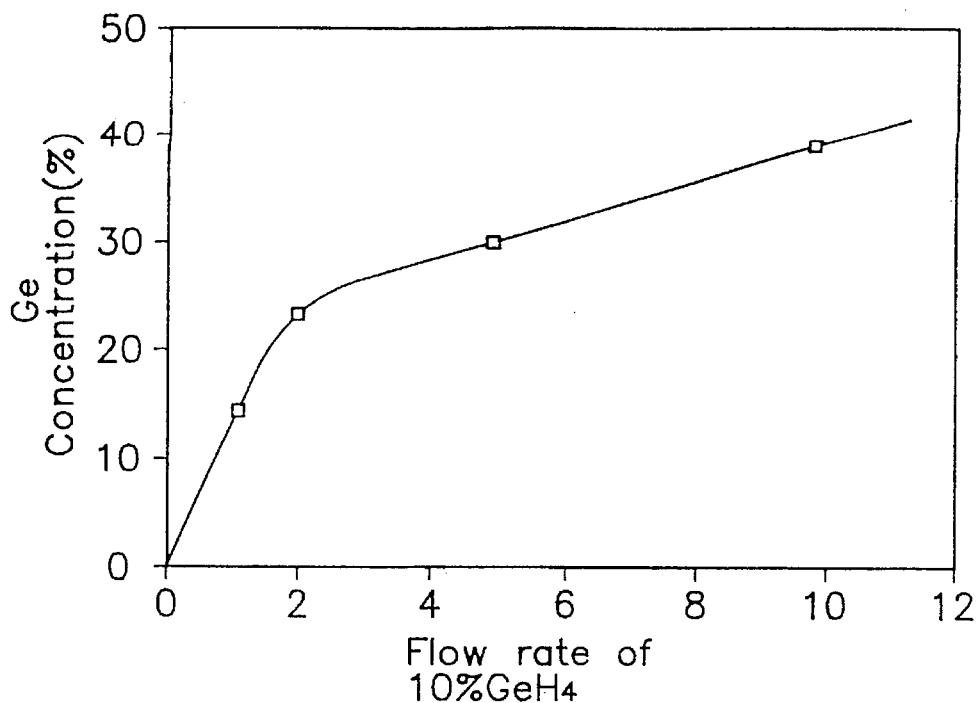
FIG. 5 is a graph showing the relationship between flow rate of 10% $GeH_4$ and composition ratio of $Si_{1-x}Ge_x$.

FIG. 5 is a graph showing a relationship of a change in the content of Ge according to the flow rate of 10% $GeH_4$. The composition ratio x of the $Si_{1-x}Ge_x$ epi-layer is changed to 0.4 according to the graph shown in FIG. 5. The grown $Si_{1-x}Ge_x$ epilayer 21 does not contain dopant but doped $Si_{1-x}Ge_x$ may be used, if necessary.

A doped epitaxial layer is formed by flowing $B_{2H6}$ gas or $PH_3$ gas at the time of the epitaxial process. A second resistance control layer 23 is formed using an epi-process as in the previous step shown in FIG. 3C. As is widely known, its condition is the same as the growth condition of the $Si_{1-x}Ge_x$ epi-layer 21, and the flow rate of $SiH_2Cl_2$ is zero to form the Ge epi-layer 23. The thickness of the Ge epi-layer 23 is about 50 Å–100 Å. If the conductivity type of the junction region 13 is P+, the third group element in the periodic table, e.g. B or $BF_2$, is ion-implanted.

In case of N+ type junction region 13, As or P is ion-implanted. The ion-implantation is performed at 20 50 KeV, at a dose of $5 \times 10^{14} 1 \times 10^{15}$ (ions/cm²).

A barrier layer 17 is formed on the second resistance control layer 23, the insulating layer 15 is formed through the above process, and a heat treatment is performed.

In this embodiment, only one barrier layer 17 is provided. However, two barrier layers may be provided in a second embodiment that will be described later.

Figure 3D:
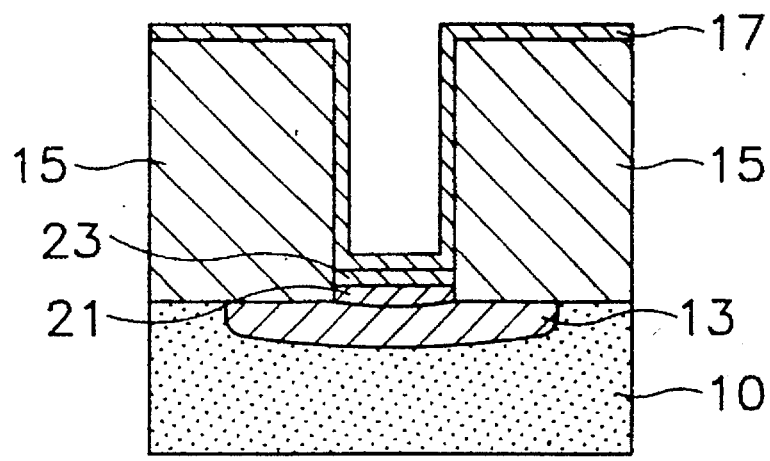
Figure 3E:
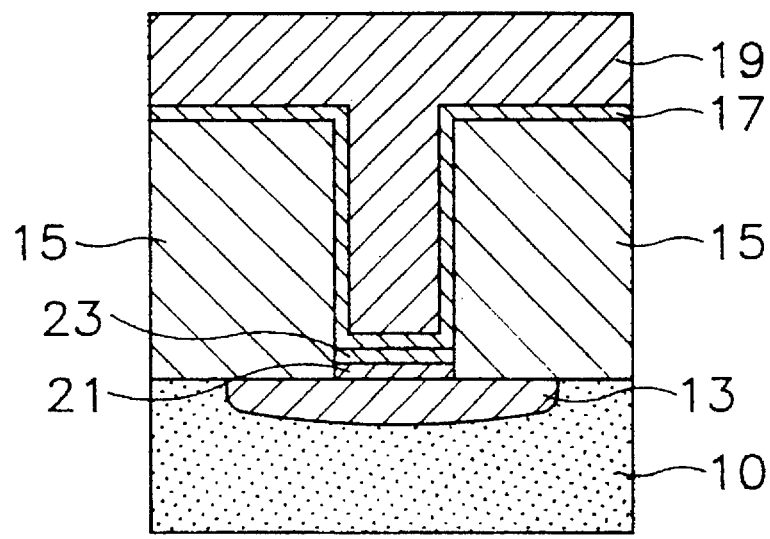

First, titanium is deposited by sputtering to a thickness of about 500 Å–1500 Å, and annealed at about 600° C. –900° C. in a passive ambient of N for a short time period to form a structure as shown in FIG. 3D. Such a heating treatment performed for a very short time period may be available by means of rapid thermal annealing (RTA) device. While titanium contacting the second resistance control layer 23 becomes TiGe$_x$ by annealing, the rest of the titanium that does not contact the second resistance control layer 23 reacts with N$_2$ in the atmosphere, and titanium nitride serving as a diffusion barrier layer is formed thereon. Finally, a conductive layer 19 used as an electronic line is formed by burying the contact hole with the metal layer, as shown in FIG. 3E.

Figure 4A:
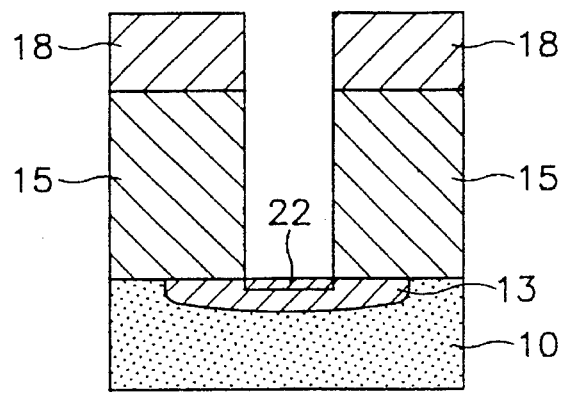
FIGS. 4A to 4C show process steps in the manufacture of a contact structure of a semiconductor device according to preferred embodiments of the present invention.
Figure 4B:
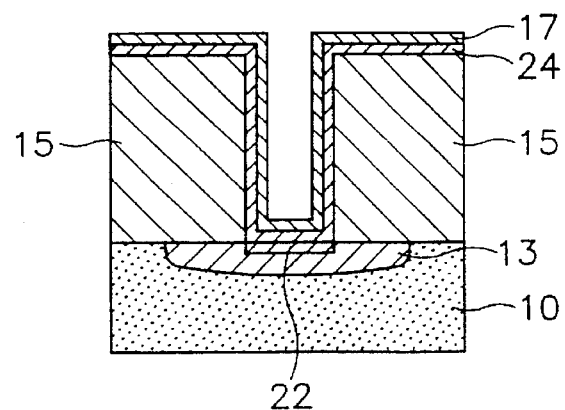
Figure 4C:
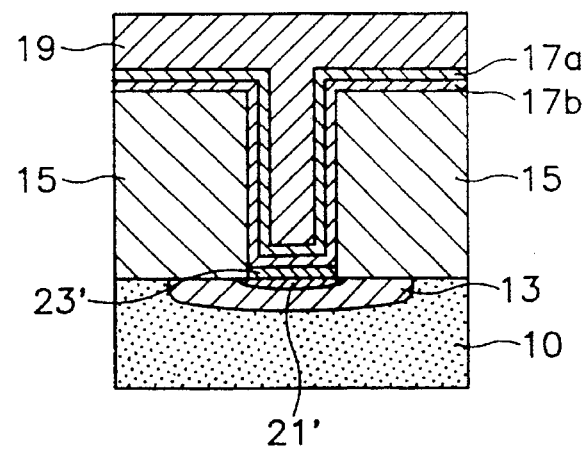

FIGS. 4A to 4C show steps in the manufacture of a contact structure of a semiconductor device in accordance with a second preferred embodiment of this invention. The common description as between FIGS. 3A to 3E and 4A to 4C will be omitted, with similar reference numerals and letters designating similar structure.

According to this embodiment, a first resistance control layer is formed by a post heating treatment after Ge is ion-implanted not by an epitaxial process but rather by ion-implantation.

First, by using a photosensitive layer 18 as a mask, Ge is ion-implanted at a accelerating voltage of 10–30 KeV and at a dose of $1\times10^{15}$–$10^{16}$ ions/cm$^2$, with low energy to form a Ge implantation layer 22 in the junction region 13, as shown in FIG. 4A. If the accelerating voltage is 20 keV, the projected range is about 200 Å, and if the accelerating voltage is 30 ReV, the projected range is about 260 Å. If the accelerating voltage is 10 KeV, the projected range is about 125 Å.

Referring now to FIG. 4B, after the photoresist layer 18 is removed, Ge and Ti are serially deposited on the Ge implantation layer 22 and the insulating layer 15 to form a Ge deposition layer 24 and a Ti deposition layer 17, respectively to a thickness of about 100–500 Åat a deposition speed of 10–50 Å/sec and at substrate temperatures of 200° C., by a sputtering device.

In the step as shown in FIG. 4C, the above Ge implantation layer 22 becomes a first resistance control layer 21' of Si$_{1-x}$Ge$_x$, according to an activation effect by a high temperature heating treatment and reaction with the silicon.

The Ge deposition layer 24 on the above described Ge implantation layer 22 remains as a second resistance control layer 23' of Ge. The Ge deposition layer 24 on the upper and side portions of the insulating layer 15 becomes a first barrier layer 17a of TiGe$_x$ by reacting with Ti. TiN is deposited by sputtering to a thickness of about 500 Å–1500 Å and serves as a second barrier layer 17b. After serially depositing Ti and TiN, a heat treatment may be used. Rapid thermal annealing is performed for 20–60 seconds at 600° C. 900° C. in an ambient of N$_2$, or the heat treatment is performed for 30–60 minutes in an ambient of N$_2$ at 450° C.–600° C. in an ambient of N$_2$. For reference, the first barrier layer 17a, TiGe$_x$ is formed to have the lowest sheet resistance (20 μΩ/cm$^2$) if the rapid thermal annealing is performed for 20 seconds at 800° C.

As described above, the present invention provides a contact structure of a hetero-junction of Ge and Si$_{1-x}$Ge$_x$ whose bandgap is lower than a substrate material to the interface between the metal and semiconductor, which may be usefully applied to obtain low resistance electronic lines and a high reliability of the resultant semiconductor device.

Figure 6:
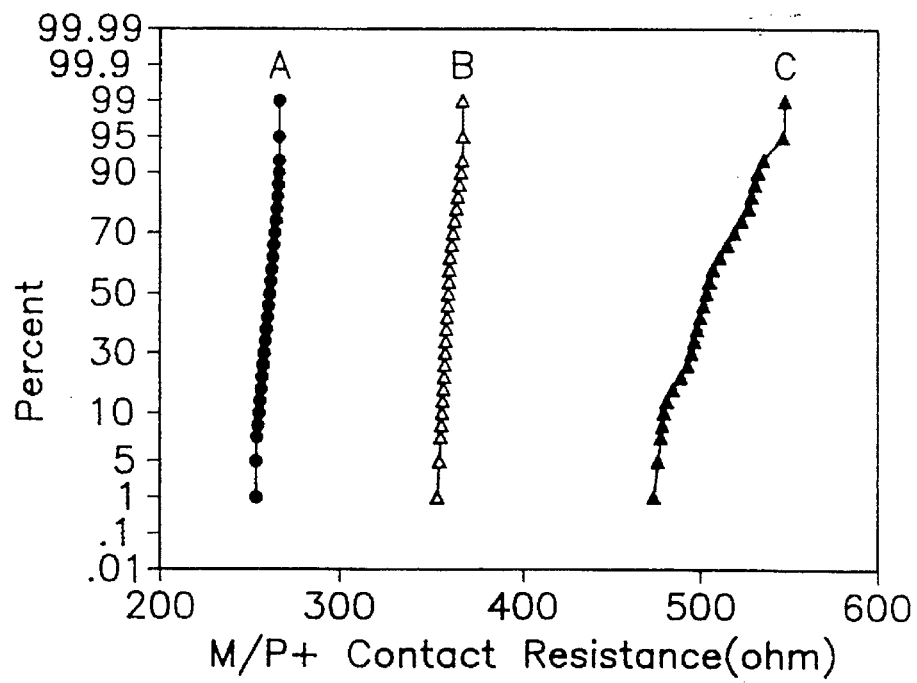
FIG. 6 is a graph showing the contact resistance between a metal and semiconductor, according to each contact structure of the present invention.

Advantages of the present invention are shown in the graph of FIG. 6. FIG. 6 sums up resultants produced by gauging a contact-resistance between the metal and semiconductor by using as a test pattern a contact string having 1200 contact holes. A resultant of Ge/Si$_{1-x}$Ge$_x$ hetero-contact structure of this invention is indicated by "A" in the graph. "B" is a contact structure to which only Ge is ion-implanted, and "C" is a conventional contact structure to which Ge is not ion-implanted. The size of each contact hole is 0.5 μm and the semiconductor layer is a P+ type area to which BF$_2$ is ion-implanted at a dose of $1\times10^{15}$. The heat treatment is performed for 120 minutes at 850° C. at an ambient of N$_2$. According to the contact structure of the present invention, the contact resistance is reduced by about two times.

While this invention is described in connection with what is presently considered to be the most practical and preferred embodiments, it is to be understood that the invention is not limited to the disclosed embodiments. On the contrary, one of ordinary skill in the art would appreciate that the present invention covers various modifications and equivalent arrangements included within the spirit and scope of the appended claims.

What is claimed is:

1. An ohmic contact structure of a semiconductor device, comprising:

a semiconductor substrate;

a junction region doped with an impurity on said semiconductor substrate;

a first resistance control layer having a reduced resistivity and selectively provided on a contact hole over said junction region with a material of a heterojunction structure whose band gap is narrower than that of a material of said semiconductor substrate;

a second resistance control layer formed of Ge, having a reduced resistivity, and having a work function which is lower than that of said first resistance control layer; and a conductive layer forming a wiring electrode provided on said second resistance control layer.

2. The ohmic contact structure according to claim 1, wherein:

said first resistance control layer is formed of Si$_{1-x}$Ge$_x$.

3. The ohmic contact structure according to claim 2, wherein:

said x of said Si$_{1-x}$Ge$_x$ is within a range of 0<x<1.

4. The ohmic contact structure according to claim 1, further comprising:

at least one barrier layer inserted between said conductive layer and second resistance control layer, said at least one barrier layer preventing a reaction between said junction region and said conductive layer.

* * * * *